United States Patent
Chen (10) Patent No.: US 10,012,201 B1
(45) Date of Patent: Jul. 3, 2018

(54) METHOD FOR CONTROLLING A STOP/START VEHICLE

(71) Applicant: Ford Global Technologies, LLC, Dearborn, MI (US)

(72) Inventor: Hanyang B. Chen, Canton, MI (US)

(73) Assignee: Ford Global Technologies, LLC, Dearborn, MI (US)

( * ) Notice: Subject to any disclaimer, the term of this patent is extended or adjusted under 35 U.S.C. 154(b) by 0 days.

(21) Appl. No.: 15/491,275

(22) Filed: Apr. 19, 2017

(51) Int. Cl.
  *F02N 11/08* (2006.01)
  *G01R 31/36* (2006.01)

(52) U.S. Cl.
  CPC ...... *F02N 11/0825* (2013.01); *F02N 11/0818* (2013.01); *F02N 11/0848* (2013.01); *G01R 31/3693* (2013.01)

(58) Field of Classification Search
  CPC .. F02N 11/0818; F02N 11/0825; F02N 11/04; F02N 11/0848; F02N 11/0803; F02N 11/0811; F02N 11/0833; F02N 11/084; F02N 11/0862; F02N 11/0866; F02N 11/108; F02N 11/106; F02N 11/101; F02N 11/105; F02N 2200/046; F02N 2200/061; F02N 2200/062; F02N 2200/0809; F02N 2200/044; F02N 2200/045; F02N 2300/2006; F02N 2300/102; F02N 2300/104; F02N 2300/106; G01R 31/3679; G01R 31/3662; G01R 31/3648; G01R 31/3693
  USPC .......................................................... 324/430
  See application file for complete search history.

(56) References Cited

U.S. PATENT DOCUMENTS

| | | | |
|---|---|---|---|
| 8,536,872 B2 * | 9/2013 | Ueda ................. | G01R 31/3624 320/132 |
| 2004/0251875 A1 * | 12/2004 | Kinoshita .......... | B60L 11/1851 320/136 |
| 2010/0217484 A1 * | 8/2010 | Mizuno .............. | F02N 11/0818 701/36 |
| 2010/0269776 A1 * | 10/2010 | Mizuno .................. | F02D 29/06 123/179.4 |
| 2013/0018569 A1 | 1/2013 | Sangameswaran et al. | |

* cited by examiner

*Primary Examiner* — Lindsay Low
*Assistant Examiner* — George Jin
(74) *Attorney, Agent, or Firm* — Julia Voutyras; McCoy Russell LLP (57) ABSTRACT

A method for allowing or prohibiting automatic engine stopping and starting is presented. In one example, an engine cranking time is predicted and compared to a threshold value to determine whether or not automatic engine stopping and starting is to be allowed or prohibited. The predicted engine cranking time is a metric for judging whether or not vehicle occupants might find a possible subsequent vehicle operation delay objectionable due to an engine starting event.

20 Claims, 7 Drawing Sheets

METHOD FOR CONTROLLING A STOP/START VEHICLE

FIELD

The present description relates to methods and a system for operating a powertrain of a vehicle that includes an internal combustion engine that may be automatically stopped and started. The methods and systems may be particularly useful for prohibiting automatic engine stopping during conditions where engine cranking may last longer than a threshold amount of time.

BACKGROUND AND SUMMARY

An internal combustion engine of a vehicle may be automatically stopped during conditions when a driver is requesting less than a threshold amount of torque. The engine may be automatically stopped while the vehicle is decelerating or after the vehicle has come to a complete stop. During automatic engine stop, delivery of fuel to the engine may cease and engine rotation may stop. By ceasing combustion and stopping the engine, it may be possible to conserve fuel and extend driving range of a vehicle. It may be desirable to stop the engine frequently to increase vehicle fuel economy. However, if the vehicle's battery is in a low state of charge, the engine may not restart due to insufficient engine cranking torque. Further, if the engine is stopped, it may take longer than a threshold amount of time to restart the engine. The engine starting time may increase when there is partial degradation of the engine cranking system. For example, the engine cranking time may increase when battery state of charge is low, battery internal resistance is high, aged starter, or when engine lubrication is different than is expected. The engine cranking time may be within an expected threshold time duration when components of the engine cranking system are not degraded. A driver or passenger of the vehicle may notice an extended engine cranking time and find it to be objectionable.

The inventor herein has recognized the above-mentioned issues and have developed a vehicle operating method, comprising: automatically stopping and starting an engine; and prohibiting automatic stopping of the engine in response to an estimated engine cranking time exceeding a threshold.

By prohibiting or not permitting automatic engine stopping in response to an estimated engine cranking time, it may be possible to prevent excessive engine cranking times while still permitting automatic engine stopping when engine cranking times are expected to be short. Consequently, at least a portion of vehicle fuel economy gains achieved through automatic engine stopping may be preserved without vehicle occupants having to endure long engine cranking times. Further, estimates of engine cranking durations may be revised to reflect data captured during most recent automatic engine starting conditions so that the engine cranking estimates may be made more accurate.

The present description may provide several advantages. For example, the approach may reduce the possibility of vehicle occupants objecting to long engine cranking times. Further, the approach enables fuel to be conserved by permitting automatic engine stopping and starting when engine cranking times are expected or estimated to be less than a threshold amount of time. In addition, the approach may dynamically change how engine cranking time is estimated to accommodate different vehicle platforms and to maintain system functionality during some conditions of system degradation.

The above advantages and other advantages, and features of the present description will be readily apparent from the following Detailed Description when taken alone or in connection with the accompanying drawings.

It should be understood that the summary above is provided to introduce in simplified form a selection of concepts that are further described in the detailed description. It is not meant to identify key or essential features of the claimed subject matter, the scope of which is defined uniquely by the claims that follow the detailed description. Furthermore, the claimed subject matter is not limited to implementations that solve any disadvantages noted above or in any part of this disclosure.

DETAILED DESCRIPTION

Figure 1:
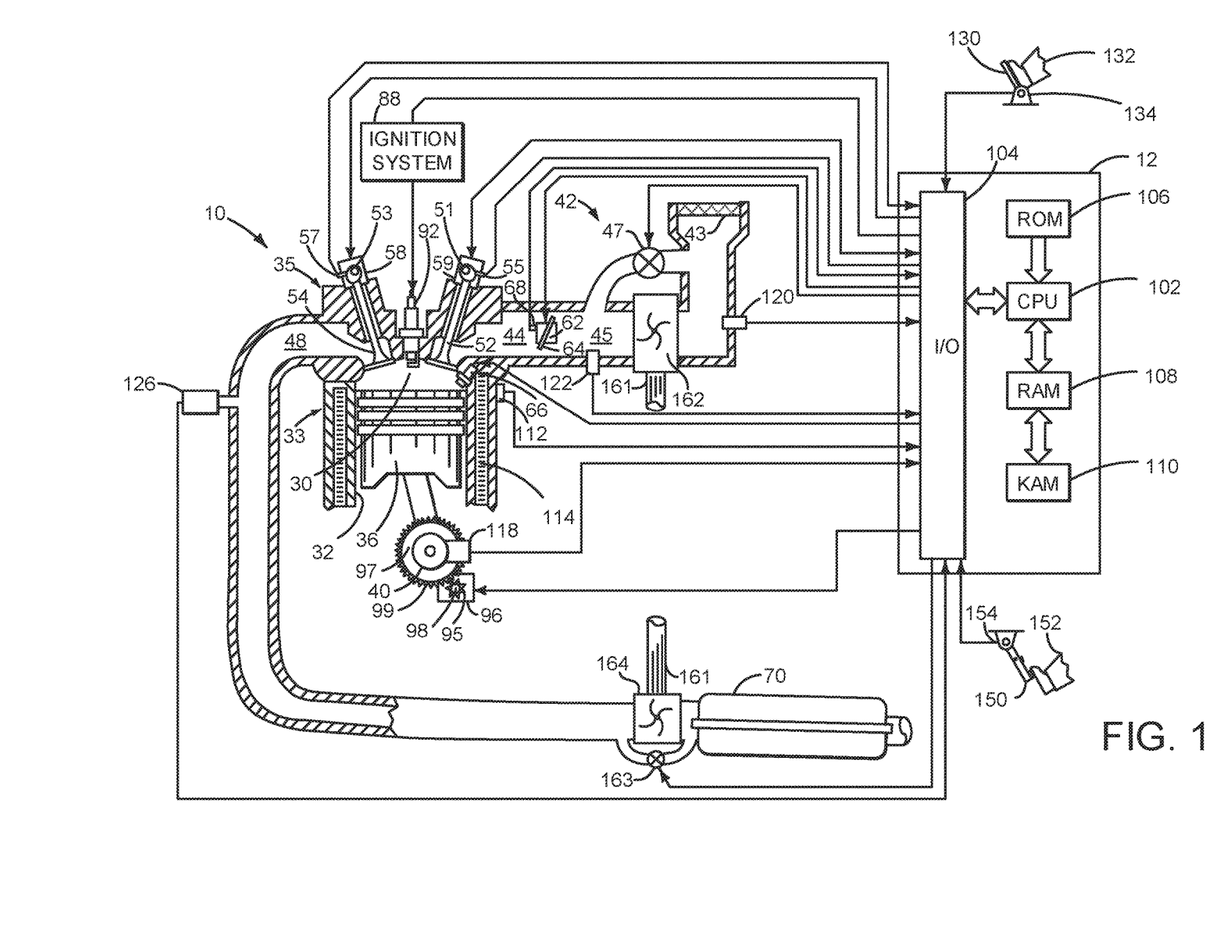
FIG. 1 shows a schematic diagram of an internal combustion engine that may be automatically stopped and started.
Figure 3:
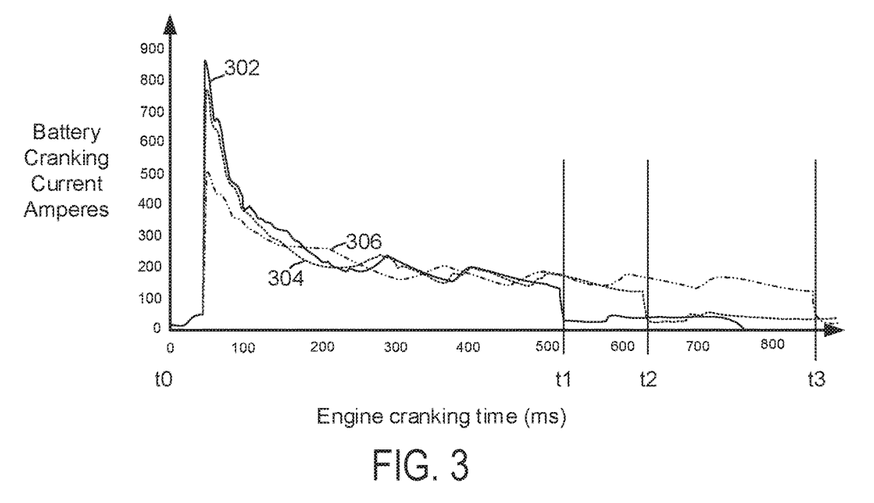
FIG. 3 shows example engine cranking currents for three different batteries.
Figure 4:
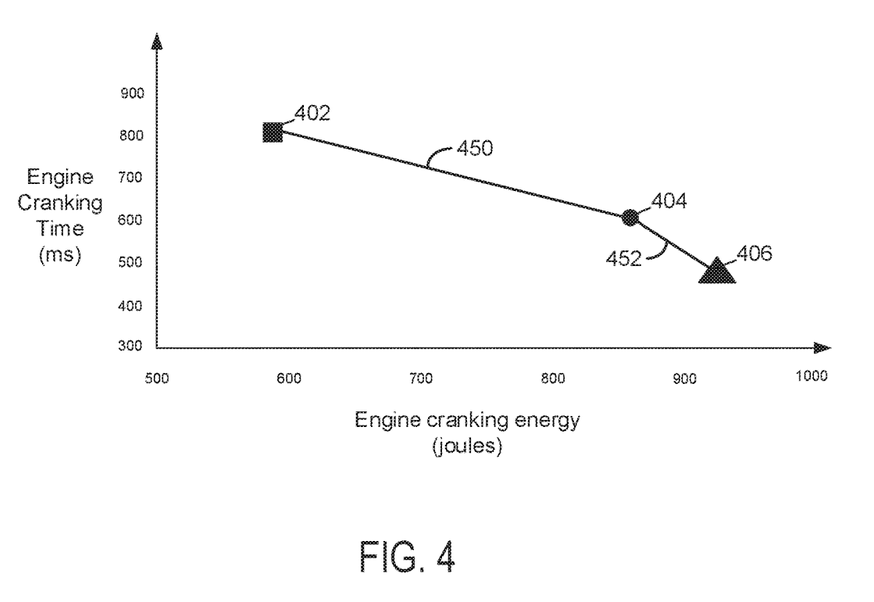
FIG. 4 shows example engine cranking times for different amounts of engine cranking energy.
Figure 5:
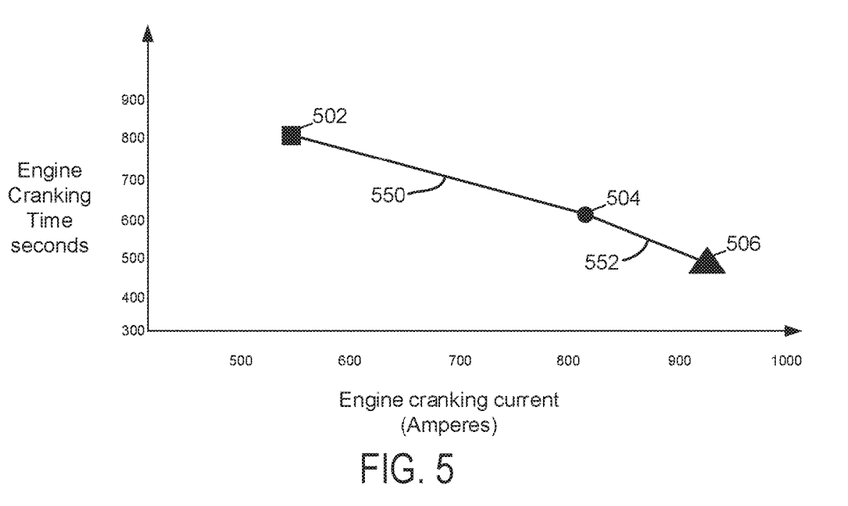
FIG. 5 shows example engine cranking time for different engine cranking currents.
Figure 6:
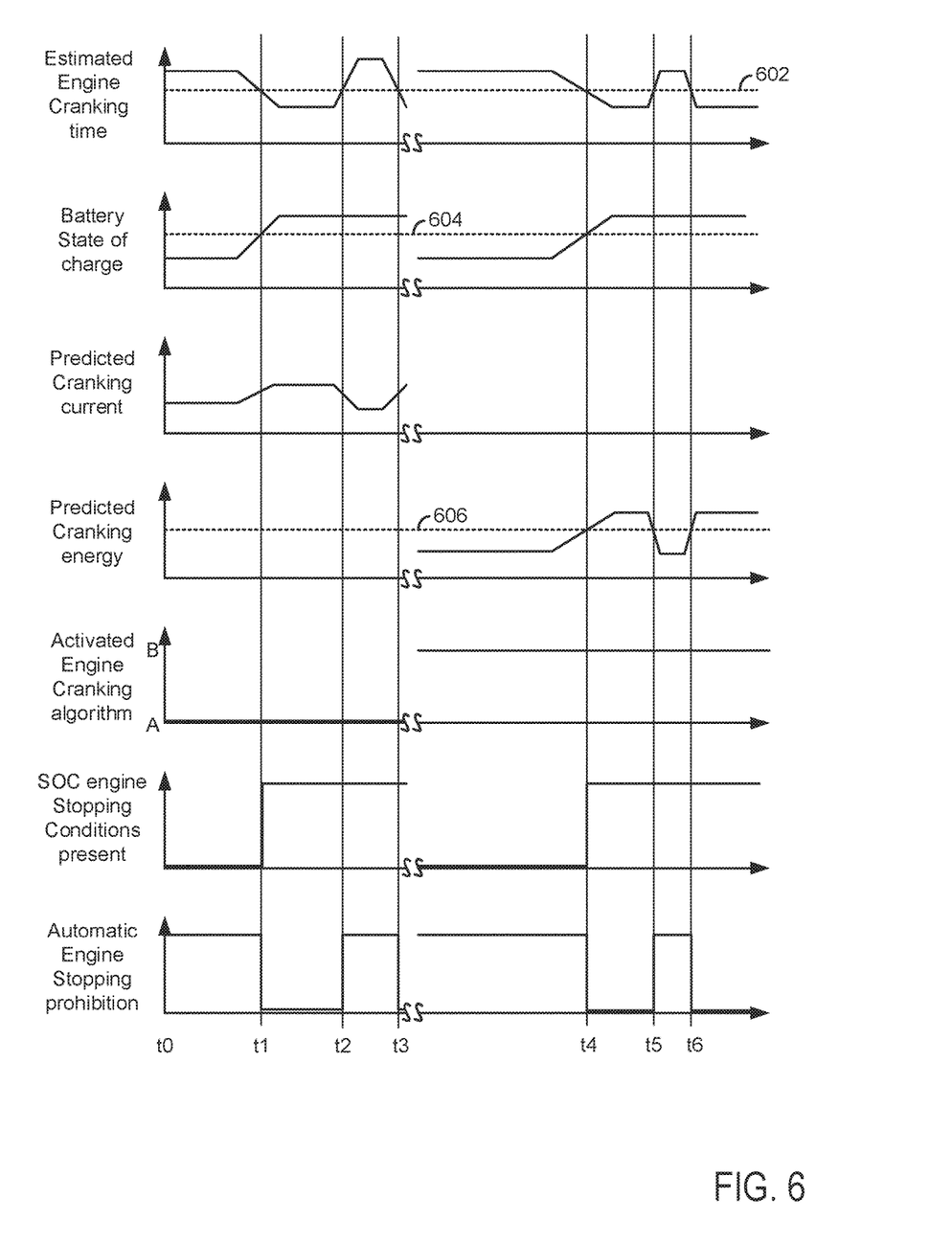
FIG. 6 shows an example vehicle operating sequence according to the method of FIG. 7.
Figure 7:
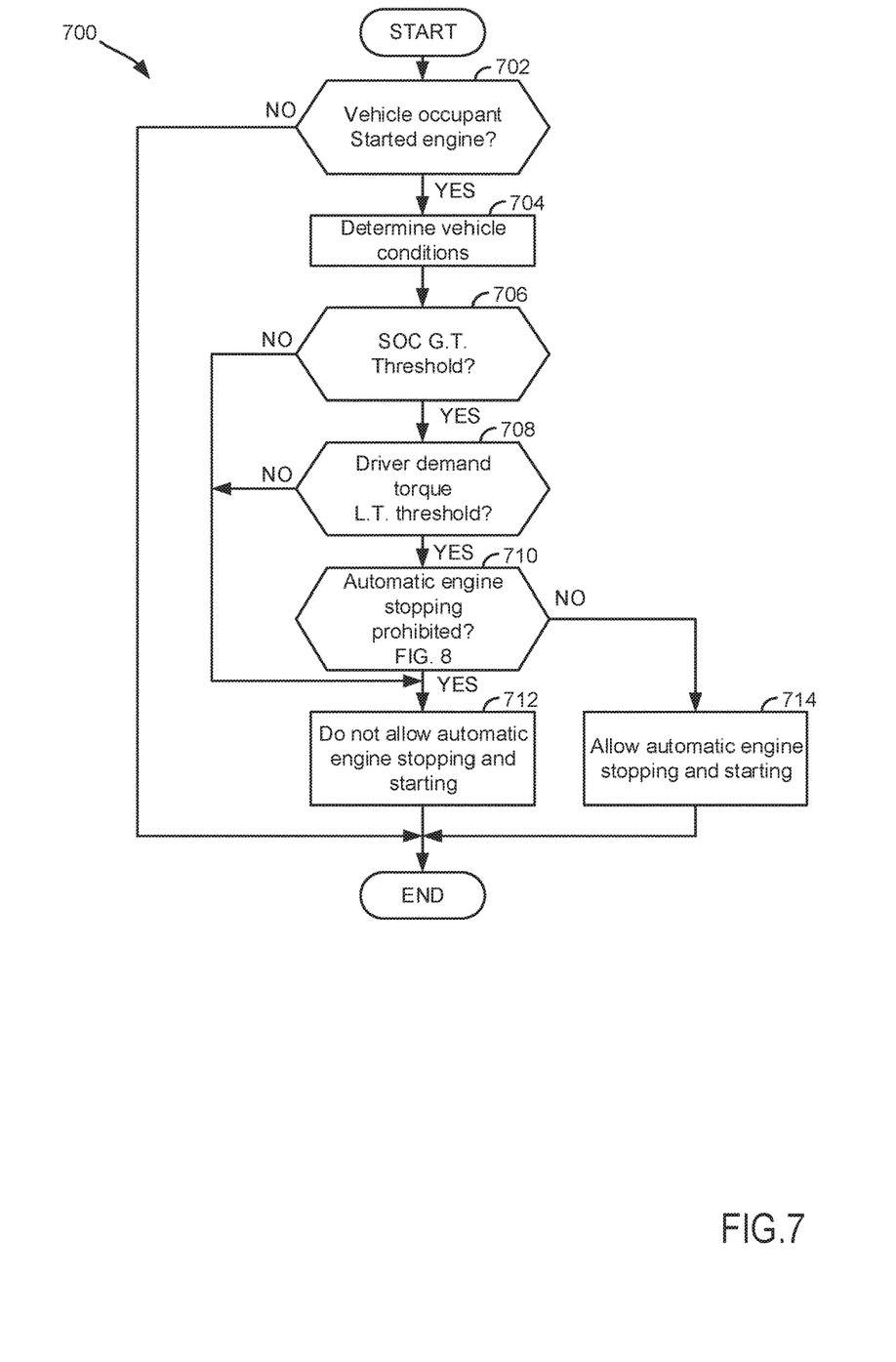
FIG. 7 shows an example method for operating a vehicle.
Figure 8:
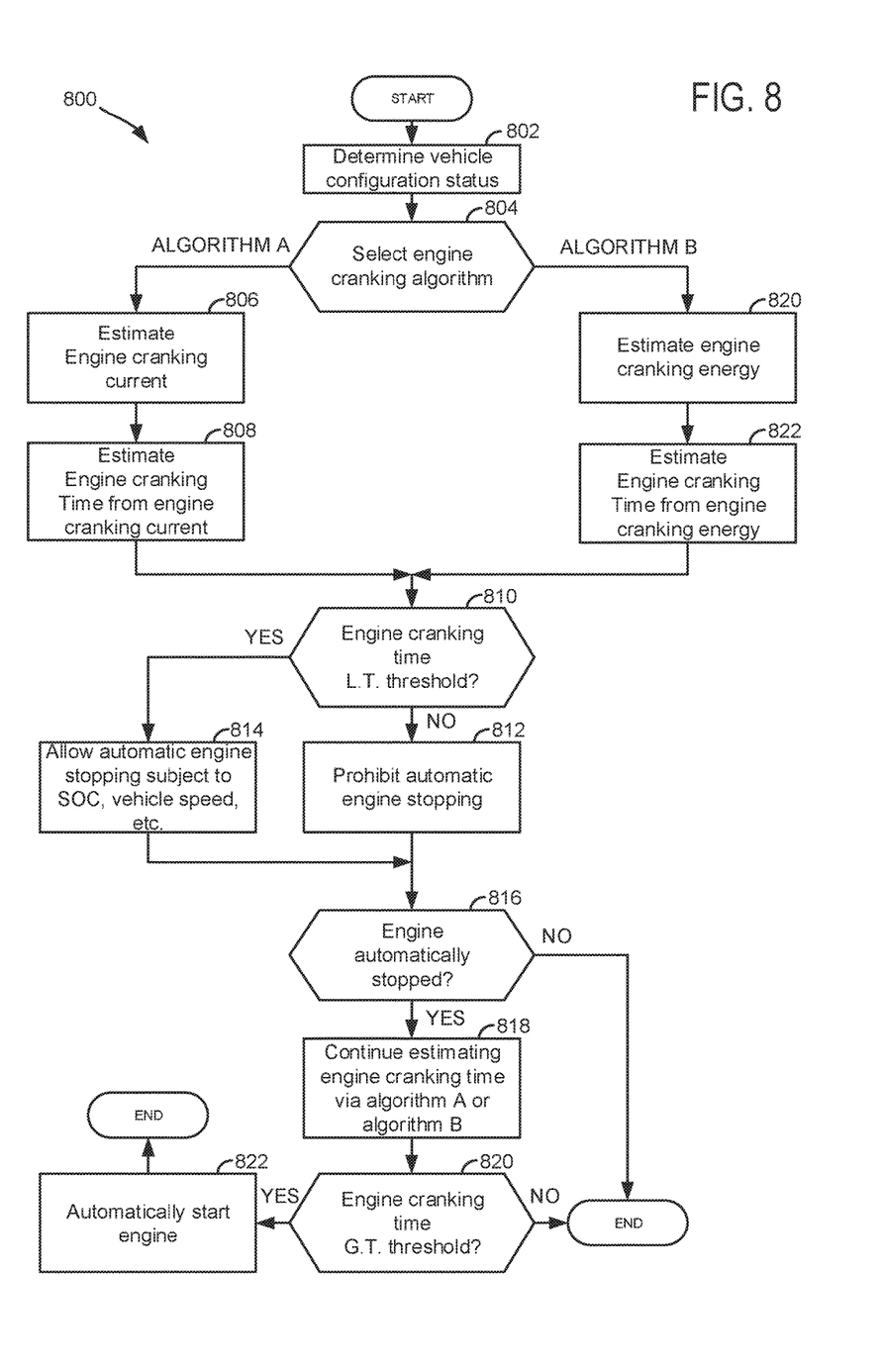
FIG. 8 shows an example method for prohibiting automatic engine starting and stopping.

The present description is related to authorizing and prohibiting a vehicle from entering an automatic engine starting and stopping mode. The automatic engine starting and stopping mode may stop an engine without vehicle occupants requesting an engine stop via a dedicated input (e.g., a key switch or a button) that has a sole function of starting and stopping the engine. FIG. 1 shows an engine that may be automatically stopped and started. The engine may be automatically started via the electrical system shown in FIG. 2. FIGS. 3-5 show example engine cranking conditions during different operating conditions. An example vehicle operating sequence according to the method of FIGS. 7 and 8 is shown in FIG. 6. A method for authorizing or prohibiting entry into an automatic engine starting and stopping mode is shown in FIG. 7. A method for prohibiting automatic engine starting and stopping is shown in FIG. 8.

Referring to FIG. 1, internal combustion engine 10, comprising a plurality of cylinders, one cylinder of which is shown in FIG. 1, is controlled by electronic engine controller 12. Engine 10 is comprised of cylinder head 35 and block 33, which include combustion chamber 30 and cylinder walls 32. Piston 36 is positioned therein and reciprocates via a connection to crankshaft 40. Flywheel 97 and ring gear 99 are coupled to crankshaft 40. Starter 96 (e.g., low voltage (operated with less than 30 volts) electric machine) includes pinion shaft 98 and pinion gear 95. Pinion shaft 98 may selectively advance pinion gear 95 to engage ring gear 99. Starter 96 may be directly mounted to the front of the engine or the rear of the engine. In some examples, starter 96 may selectively supply torque to crankshaft 40 via a belt or chain.

In one example, starter 96 is in a base state when not engaged to the engine crankshaft. Combustion chamber 30 is shown communicating with intake manifold 44 and exhaust manifold 48 via respective intake valve 52 and exhaust valve 54. Each intake and exhaust valve may be operated by an intake cam 51 and an exhaust cam 53. The position of intake cam 51 may be determined by intake cam sensor 55. The position of exhaust cam 53 may be determined by exhaust cam sensor 57. Intake valve 52 may be selectively activated and deactivated by valve activation device 59. Exhaust valve 54 may be selectively activated and deactivated by valve activation device 58. Valve activation devices 58 and 59 may be electro-mechanical devices.

Fuel injector 66 is shown positioned to inject fuel directly into cylinder 30, which is known to those skilled in the art as direct injection. Fuel injector 66 delivers liquid fuel in proportion to the pulse width from controller 12. Fuel is delivered to fuel injector 66 by a fuel system (not shown) including a fuel tank, fuel pump, and fuel rail (not shown). In one example, a high pressure, dual stage, fuel system may be used to generate higher fuel pressures.

In addition, intake manifold 44 is shown communicating with turbocharger compressor 162 and engine air intake 42. In other examples, compressor 162 may be a supercharger compressor. Shaft 161 mechanically couples turbocharger turbine 164 to turbocharger compressor 162. Optional electronic throttle 62 adjusts a position of throttle plate 64 to control air flow from compressor 162 to intake manifold 44. Pressure in boost chamber 45 may be referred to a throttle inlet pressure since the inlet of throttle 62 is within boost chamber 45. The throttle outlet is in intake manifold 44. In some examples, throttle 62 and throttle plate 64 may be positioned between intake valve 52 and intake manifold 44 such that throttle 62 is a port throttle. Compressor recirculation valve 47 may be selectively adjusted to a plurality of positions between fully open and fully closed. Waste gate 163 may be adjusted via controller 12 to allow exhaust gases to selectively bypass turbine 164 to control the speed of compressor 162. Air filter 43 cleans air entering engine air intake 42.

Distributorless ignition system 88 provides an ignition spark to combustion chamber 30 via spark plug 92 in response to controller 12. Universal Exhaust Gas Oxygen (UEGO) sensor 126 is shown coupled to exhaust manifold 48 upstream of catalytic converter 70. Alternatively, a two-state exhaust gas oxygen sensor may be substituted for UEGO sensor 126.

Converter 70 can include multiple catalyst bricks, in one example. In another example, multiple emission control devices, each with multiple bricks, can be used. Converter 70 can be a three-way type catalyst in one example.

Controller 12 is shown in FIG. 1 as a conventional microcomputer including: microprocessor unit 102, input/output ports 104, read-only memory 106 (e.g., non-transitory memory), random access memory 108, keep alive memory 110, and a conventional data bus. Controller 12 is shown receiving various signals from sensors coupled to engine 10, in addition to those signals previously discussed, including: engine coolant temperature (ECT) from temperature sensor 112 coupled to cooling sleeve 114; a position sensor 134 coupled to an accelerator pedal 130 for sensing force applied by foot 132; a position sensor 154 coupled to brake pedal 150 for sensing force applied by foot 152, a measurement of engine manifold pressure (MAP) from pressure sensor 122 coupled to intake manifold 44; an engine position sensor from a Hall effect sensor 118 sensing crankshaft 40 position; a measurement of air mass entering the engine from sensor 120; and a measurement of throttle position from sensor 68. Barometric pressure may also be sensed (sensor not shown) for processing by controller 12. In a preferred aspect of the present description, engine position sensor 118 produces a predetermined number of equally spaced pulses every revolution of the crankshaft from which engine speed (RPM) can be determined.

During operation, each cylinder within engine 10 typically undergoes a four stroke cycle: the cycle includes the intake stroke, compression stroke, expansion stroke, and exhaust stroke. During the intake stroke, generally, the exhaust valve 54 closes and intake valve 52 opens. Air is introduced into combustion chamber 30 via intake manifold 44, and piston 36 moves to the bottom of the cylinder so as to increase the volume within combustion chamber 30. The position at which piston 36 is near the bottom of the cylinder and at the end of its stroke (e.g. when combustion chamber 30 is at its largest volume) is typically referred to by those of skill in the art as bottom dead center (BDC).

During the compression stroke, intake valve 52 and exhaust valve 54 are closed. Piston 36 moves toward the cylinder head so as to compress the air within combustion chamber 30. The point at which piston 36 is at the end of its stroke and closest to the cylinder head (e.g. when combustion chamber 30 is at its smallest volume) is typically referred to by those of skill in the art as top dead center (TDC). In a process hereinafter referred to as injection, fuel is introduced into the combustion chamber. In a process hereinafter referred to as ignition, the injected fuel is ignited by known ignition means such as spark plug 92, resulting in combustion.

During the expansion stroke, the expanding gases push piston 36 back to BDC. Crankshaft 40 converts piston movement into a rotational torque of the rotary shaft. Finally, during the exhaust stroke, the exhaust valve 54 opens to release the combusted air-fuel mixture to exhaust manifold 48 and the piston returns to TDC. Note that the above is shown merely as an example, and that intake and exhaust valve opening and/or closing timings may vary, such as to provide positive or negative valve overlap, late intake valve closing, or various other examples.

Figure 2:
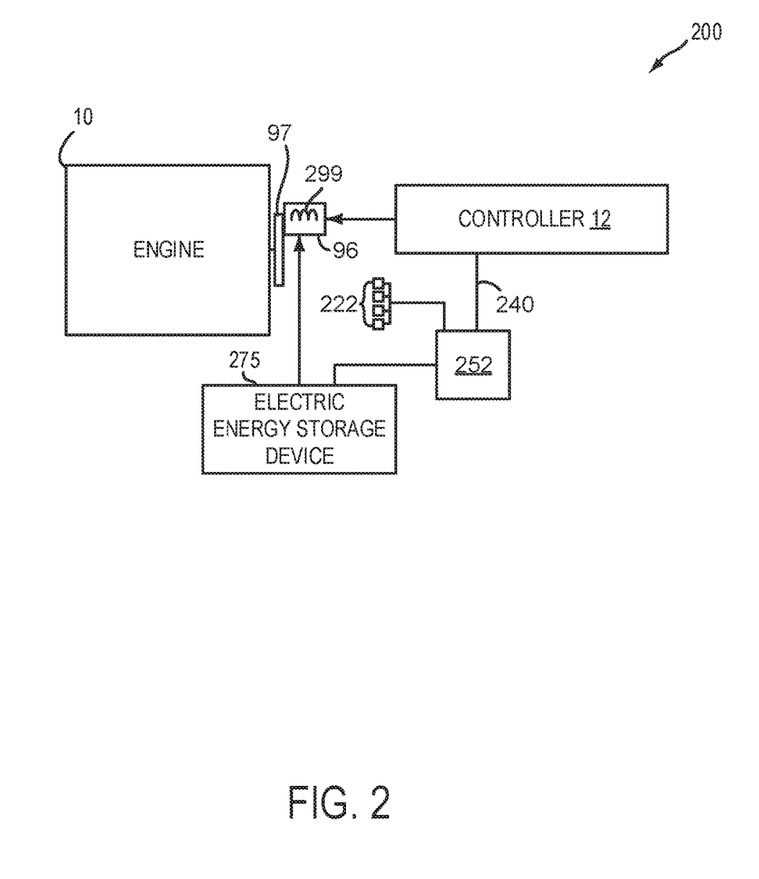
FIG. 2 shows a schematic diagram of electrical components of an engine starting system for the internal combustion engine shown in FIG. 1.

FIG. 2 is a schematic depiction showing electrical components of an engine starting system 200. The engine starting system may automatically start the internal combustion engine shown in FIG. 1.

Engine 10 may be automatically started in response to outputs of controller 12. In particular, controller 12 may start engine 10 via commanding engagement of starter 96 to flywheel 97 and rotating a crankshaft of engine 10. Electric energy storage device (e.g., battery) 275 supplies electrical power to engine starter 96 and electric energy storage device management system 252 senses voltages, current, resistances, and temperatures of electric energy storage device 275 and starter 96 via sensors 222. For example, sensors 222 may be used to determine resistance of starter motor windings 299, voltages, temperatures, and current in the engine starting system 200. After engine 10 reaches a predetermined speed, controller 12 may supply fuel and spark to engine 10. Controller 12 disengages starter 96 from flywheel 97 and engine 10 after engine 10 reaches a predetermined speed or after engine 10 has been cranked for a predetermined amount of time.

Thus, the system of FIGS. 1 and 2 provides for 16 a vehicle system, comprising: an engine including a starter motor; a battery selectively supplying charge to the starter motor; and a controller including executable instructions stored in non-transitory memory to predict an engine cranking time while the engine is rotating and prohibit automatic stopping of the engine in response to the predicted engine cranking time exceeding a threshold, and instructions to automatically start the engine in response to the predicted engine cranking time exceeding the threshold while the engine is stopped due to an automatic engine stop.

The vehicle system further comprises instructions to predict the engine cranking time based on a maximum engine cranking current. The vehicle system further comprises instructions to predict the engine cranking time based on energy to crank the engine. The vehicle system includes where the engine cranking time is a time from rotating the engine from zero speed to a first combustion event since the most recent engine stop. The vehicle system includes where the engine cranking time is based on resistance of starter motor windings.

Referring now to FIG. 3, example engine cranking currents for a vehicle are shown. The example engine cranking currents are for a one year old battery (trace 302), an aged battery (trace 304), and a severely aged battery (306) providing electrical energy to crank a same vehicle under same conditions except for applying different batteries to supply electrical energy to crank the engine.

The plot shown in FIG. 3 is a plot of battery cranking current (e.g., current supplied by a battery to crank an engine at an engine cranking speed (250 RPM)) versus engine cranking time. The vertical axis represents battery cranking current and battery cranking current increases in the direction of the vertical axis arrow. The horizontal axis represents engine cranking time (e.g., the amount of time the engine is rotated via the starter from zero engine speed to a first combustion event after accelerating the engine from the most recent zero speed condition) and engine cranking time increases from the left side of the figure to the right side of the figure. Engine cranking for all three examples begins at time t0.

It may be observed, that a new battery (e.g., solid line trace 302) provides the greatest peak value of engine cranking current, about 875 amperes in this example. The slightly aged battery (e.g., dashed line trace 304) provides the second greatest peak value of engine cranking current, about 780 amperes in this example. The severely aged battery (e.g., dash-dot-dot trace 306) provides the least peak value of engine cranking current, about 510 amperes in this example.

The new battery also exhibits a shortest engine cranking time of about 520 milliseconds as indicated at the vertical marker at time t1. The slightly aged battery exhibits a next shortest engine cranking time of about 630 milliseconds as indicated at the vertical marker at time t2. The severely aged battery exhibits a longest engine cranking time of about 880 milliseconds as indicated at the vertical marker at time t3.

Thus, a newer battery may provide a higher amount of current to crank the engine, and the higher amount of current may reduce engine cranking time. Older batteries provide lower amounts of current to crank the engine, and the lower amount of current may extend engine cranking time. The longer engine cranking times and lower engine cranking currents may be at least partially attributable to increased internal resistance of aged batteries. In this way, engine cranking current may be correlated to engine cranking time, and engine cranking time may be a basis for judging vehicle occupant satisfaction and whether or not to prohibit automatic engine stopping and starting.

Referring now to FIG. 4, a plot shows example engine cranking times for different amounts of engine cranking energy. The vertical axis of the plot represents engine cranking time (e.g., an amount of time from where engine speed increases from zero to a desired non-zero desired cranking speed until a first combustion event (e.g., ignition in a cylinder) since the most recent time engine speed was zero) and engine cranking time increases in the direction of the vertical axis arrow. The horizontal axis represents engine cranking energy (e.g., amount of electrical energy used to crank the engine from a most recent engine stop until the engine starts) and engine cranking energy increases from the left side of the figure to the right side of the figure.

The plot shows data from three different engine starts. Marker 402 represents engine cranking time versus engine cranking energy for a severely aged battery. Marker 404 represents engine cranking time versus engine cranking energy for a mildly aged battery. Marker 406 represents engine cranking time versus engine cranking energy for nearly new battery. Data for all three batteries is based on starting a same engine under same conditions except for the battery used for each data point is different. Lines 450 and 452 link data points 402, 404, and 406. Equations of these lines may be determined via known methods (e.g., equation of a straight line and point/slope formula).

It may be observed that the newer battery (e.g., data point 406) provides a shortest engine cranking time and a greatest amount of engine cranking energy even though the engine cranking time is shortest. The greater amount of engine cranking energy may be due to the higher engine cranking current provided by the newer battery. The slightly or mildly aged battery (e.g., data point 404) provides a longer engine cranking time and a higher amount of engine cranking energy as compared to the severely aged battery. The severely aged battery (e.g., data point 402) provides a longest engine cranking time and a lowest amount of engine cranking energy. In this way, engine cranking energy may be correlated to an engine cranking time, and engine cranking time may be a basis for judging vehicle occupant satisfaction and whether or not to prohibit automatic engine stopping and starting. Thus, FIG. 4 is a plot of a function that may be the basis for correlating engine cranking energy to engine cranking time.

Referring now to FIG. 5, a plot shows example engine cranking times for different amounts of engine cranking current. The vertical axis of the plot represents engine cranking time and engine cranking time increases in the direction of the vertical axis arrow. The horizontal axis represents peak engine cranking current (e.g., a maximum or upper threshold current amount greater than other current to crank the engine during engine cranking from a most recent engine stop until a first combustion event since the most recent time engine speed was zero) and engine cranking current increases from the left side of the figure to the right side of the figure.

The plot shows data from three different engine starts. Marker 502 represents engine cranking time versus engine cranking current for a severely aged battery. Marker 504 represents engine cranking time versus engine cranking current for a mildly aged battery. Marker 506 represents engine cranking time versus engine cranking current for nearly new battery. Data for all three batteries is based on starting a same engine under same conditions except for the battery used for each data point is different. Lines 550 and 552 link data points 502, 504, and 506. Equations of these lines may be determined via known methods (e.g., equation of a straight line and point/slope formula).

It may be observed that the newer battery (e.g., data point 506) provides a shortest engine cranking time and a greatest amount of engine cranking current. The slightly or mildly aged battery (e.g., data point 504) provides a longer engine cranking time and a higher amount of engine cranking current as compared to the severely aged battery. The severely aged battery (e.g., data point 502) provides a longest engine cranking time and a lowest amount of engine cranking current. In this way, engine cranking current may be correlated to an engine cranking time, and engine cranking time may be a basis for judging vehicle occupant satisfaction and whether or not to prohibit automatic engine stopping and starting. Thus, FIG. 5 is a plot of a function that may be the basis for correlating maximum engine cranking current to engine cranking time.

Referring now to FIG. 6, an example sequence performed according to the method of FIG. 7 is shown. The sequence of FIG. 6 may be provided by the system of FIGS. 1 and 2. The various plots of FIG. 6 are time aligned and occur at a same time. Vertical lines at times t0-t6 represent times of particular interest in the sequence. The prophetic sequence shown in FIG. 6 shows conditions where automatic engine stopping and starting is prevented or prohibited. The SS marks along each horizontal axis represent a brake in time and the brake may be short or long in duration.

The first plot from the top of FIG. 6 is a plot of estimated engine cranking time versus time. The vertical axis represents estimated engine cranking time and estimated engine cranking time increases in the direction of the vertical axis arrow. The horizontal axis represents time. Time begins on the left side of the figure and increases to the right side of the figure.

The second plot from the top of FIG. 6 is a plot of battery state of charge (SOC) versus time. The vertical axis represents battery state of charge and battery state of charge increases in the direction of the vertical axis arrow. The horizontal axis represents time. Time begins on the left side of the figure and increases to the right side of the figure.

The third plot from the top of FIG. 6 is a plot of predicted peak or maximum engine cranking current during a next engine cranking period after a next engine stop versus time. The vertical axis represents engine cranking current and engine cranking current increases in a direction of the vertical axis arrow. The horizontal axis represents time. Time begins on the left side of the figure and increases to the right side of the figure.

The fourth plot from the top of FIG. 6 is a plot of predicted engine cranking energy during a next engine cranking period after a next engine stop versus time. The vertical axis represents engine cranking energy and engine cranking energy increases in a direction of the vertical axis arrow. The horizontal axis represents time. Time begins on the left side of the figure and increases to the right side of the figure.

The fifth plot from the top of FIG. 6 is a plot indicating which engine cranking time estimation algorithm is activated versus time. The vertical axis represents engine cranking algorithm and algorithm A is active when the trace is at a lower level near the horizontal axis. Algorithm B is active when the trace is at a higher level near the vertical axis arrow. The A and B algorithms are described in the method of FIG. 7. The horizontal axis represents time. Time begins on the left side of the figure and increases to the right side of the figure.

The sixth plot from the top of FIG. 6 is a plot indicating whether or not automatic engine stopping and starting is prohibited based on battery state of charge. Automatic engine stopping and starting is not permitted based on battery SOC when the trace is at a lower level near the horizontal axis. Automatic engine stopping and starting may be permitted based on battery SOC when the trace is at a higher level near the vertical axis arrow. The horizontal axis represents time. Time begins on the left side of the figure and increases to the right side of the figure.

The seventh plot from the top of FIG. 6 is a plot indicating whether or not automatic engine stopping and starting is prohibited based on all conditions that are the basis for prohibiting automatic engine stopping. The vertical axis represents automatic engine stopping prohibition status and automatic engine stopping is prohibited when the trace is at a higher level near the vertical axis arrow. Automatic engine stopping and starting is not prohibited when the trace is near the horizontal axis. The horizontal axis represents time. Time begins on the left side of the figure and increases to the right side of the figure.

At time t0, estimated engine cranking time is greater than threshold 602 and battery state of charge is less than threshold 604. Engine cranking time estimation algorithm A is activated so that maximum engine cranking current is estimated and predicted or estimated engine cranking energy is not estimated. The predicted maximum engine cranking current is a lower middle level since battery state of charge is low. Conditions for automatically stopping the engine responsive to battery state of charge (SOC) are not present since battery state of charge is less than threshold 604. Automatic engine stopping is prohibited so that the engine will continue to run (e.g., combusting air and fuel) because battery state of charge is less than threshold 604.

Between time t0 and time t1, the battery state of charge increases and the estimated engine cranking time based on the predicted engine cranking current decreases as the predicted engine cranking current increases. The battery state of charge may increase via an engine charging the battery or via regenerative braking (not shown). Engine cranking algorithm A remains active and automatic engine stopping conditions based on battery state of charge are not present. Engine automatic engine stopping remains prohibited since battery state of charge remains low.

At time t1, the battery state of charge is equal to or greater than threshold 604. Further, in this example, the estimated engine cranking time is reduced to equal or less than threshold 602 since the predicted engine cranking current has increased in response to the increased battery state of charge. Additionally, the trace representing whether or not automatic engine stopping conditions are present based on battery state of charge transitions from a lower level to a higher level to indicate that battery state of charge is high enough to permit automatic engine stopping. Further, the automatic engine stopping and starting prohibition trace transitions to a lower level to indicate that automatic engine stopping and starting is permitted. Automatic engine starting and stopping is permitted since battery state of charge is greater than threshold 604 and because the estimated engine cranking time is less than threshold 602. The estimated engine cranking time may be a function of engine peak cranking current. Further, engine cranking current may be a function of starter motor internal resistance, internal battery resistance, battery open circuit voltage and other electrical system parameters as discussed in further detail with regard to FIG. 7.

Between time t1 and time t2, the predicted engine cranking time decreases and then it increases. The estimated engine cranking time may increase and decrease responsive to predicted peak engine cranking current and peak engine cranking current may vary with engine electrical system parameters including but not limited to internal battery resistance, starter motor internal resistance, and battery open circuit voltage, which may change over time. The battery state of charge remains high and engine cranking algorithm A remains active. Automatic engine stopping conditions based on battery state of charge are present and automatic engine stopping prohibition is not asserted so that the engine may be automatically stopped and restarted.

At time t2, the estimated engine cranking time increases to a time equal to or greater than threshold 602. The estimated engine cranking time increases as predicted peak engine cranking current decreases. The battery state of charge remains high and engine cranking algorithm A remains active. Automatic engine stopping conditions based on battery state of charge are present, but automatic engine stopping prohibition is asserted so that the engine may not be automatically stopped and restarted. The increased engine cranking time may be objectionable to vehicle occupants so that automatic engine stopping and starting is prohibited. In this way, the vehicle may be automatically stopped and started when engine cranking times are consistently less than a predetermined threshold value. The internal resistance of the starter motor may increase and decrease responsive to the frequency of engine starting and stopping so as to adjust the predicted engine starting time.

Between time t2 and time t3, the predicted engine cranking current decreases and then increases such that the estimated engine cranking time increases and then decreases. The battery state of charge remains above threshold 604 and engine cranking algorithm A remains activated. Automatic engine stopping responsive to battery state of charge remains asserted, but automatic engine stopping prohibition is also asserted so that automatic engine stopping is prohibited because estimated engine cranking time exceeds threshold 602.

At time t3, estimated engine cranking time is equal to or less than threshold 602 so that automatic engine stopping prohibition is not asserted. Therefore, the engine may be automatically stopped and started. The predicted peak or maximum engine cranking current has increased to a level where estimated engine cranking time is less than threshold 602. Engine stopping conditions responsive to battery state of charge are present since battery state of charge is greater than threshold 604. Further, engine cranking algorithm A remains active so that peak engine cranking current is determined.

Between time t3 and time t4, a break in the sequence occurs and engine cranking algorithm B is activated. Algorithm B does not predict peak engine cranking current. Instead, algorithm B determines predicted engine cranking energy. Algorithm B also estimates engine cranking time from predicted engine cranking energy. Engine cranking time is greater than threshold 602 so that automatic engine stopping prohibition is asserted and activated so that automatic engine stopping and starting is prohibited. Battery state of charge is less than threshold 604, which results in automatic engine stopping conditions responsive to battery state of charge not being present. The predicted engine cranking energy is lower than threshold 606 so that automatic engine stopping prohibition is activated.

At time t4, the predicted engine cranking energy has increased to a value equal to or greater than threshold 606 and battery state of charge has increased to a value equal to or greater than 604. The automatic engine stopping conditions responsive to battery state of charge changes state from not asserted to asserted, and automatic engine stopping prohibition changes state from asserted to not asserted so that automatic engine stopping and starting are permitted based on battery state of charge and estimated engine cranking time. The estimated engine cranking time has decreased in response to the increase in predicted engine cranking energy.

Between time t4 and time t5, the battery state of charge continues to increase and the estimated engine cranking time also decreases and then increases near time t5. The predicted engine cranking energy increases and then decreases neat time t5. The engine cranking algorithm B remains activated. Automatic engine stopping prohibition remains deactivated so that the engine may be automatically stopped and started. Automatic engine stopping conditions based on battery state of charge are present so that the engine may be automatically stopped and started.

At time t5, the estimated engine cranking time has increased to a level equal to or greater than threshold 602 so that the automatic engine stopping and starting prohibition state changes from not asserted to asserted. As a result, automatic engine stopping and starting is prohibited even though battery state of charge is greater than threshold 604. The predicted engine cranking energy has also decreased. The predicted engine cranking energy may increase or decrease responsive to starter temperature, battery open circuit voltage, and other electrical system parameters described in greater detail in the description of FIG. 7. Engine cranking algorithm B remains active and the automatic engine stopping prohibition state changes from not asserted to asserted. The automatic engine stopping and starting state responsive to battery state of charge remains asserted since battery state of charge is greater than threshold 604. As a result, automatic engine starting and stopping is prohibited because the automatic engine stopping prohibition state is asserted.

Between time t5 and time t6, the predicted engine cranking energy decreases and then increases such that the estimated engine cranking time increases and then decreases. The battery state of charge remains above threshold 604 and engine cranking algorithm B remains activated. Automatic engine stopping responsive to battery state of charge remains asserted, but automatic engine stopping prohibition is also asserted so that automatic engine stopping is prohibited because estimated engine cranking time exceeds threshold 602.

At time t6, estimated engine cranking time is equal to or less than threshold 602 so that automatic engine stopping prohibition is not asserted. Therefore, the engine may be automatically stopped and started. The predicted engine cranking energy has increased to a level where estimated engine cranking time is less than threshold 602. Engine stopping conditions responsive to battery state of charge are present since battery state of charge is greater than threshold 604. Further, engine cranking algorithm B remains active so that engine cranking energy is determined.

In this way, algorithm A or algorithm B may be activated to provide an estimate of engine cranking time. The estimated engine cranking time may be a basis for allowing or prohibiting automatic engine stopping and starting so that vehicle occupants may find vehicle operating conditions objectionable.

Referring now to FIG. 7, a method for operating a vehicle is shown. At least portions of method 700 may be implemented as executable controller instructions stored in non-transitory memory. Additionally, portions of method 700 may be actions taken in the physical world to transform an operating state of an actuator or device. The method of FIG. 7 may be incorporated into the system of FIGS. 1 and 2 as executable instructions stored in non-transitory memory.

At 702, method 700 judges if a vehicle occupant (e.g., human driver) has requested and started the vehicle's engine. In one example, a bit in memory indicates if the vehicle has been started via an occupant. The bit may be set to indicate that the vehicle is started in response to a key switch, push button, or remote starter being applied to start the vehicle. If method 700 judges that the engine has been started (e.g., combusting air and fuel), the answer is yes and method 700 proceeds to 704. Otherwise, the answer is no and method 700 proceeds to exit.

At 704, method 700 determines vehicle operating conditions including, but not limited to battery state of charge (SOC), battery internal resistance, starter motor internal resistance (e.g., resistance of windings), driver demand torque, engine speed, vehicle speed, etc. Method 700 proceeds to 706 after determining vehicle operating conditions.

At 706, method 700 judges whether or not battery SOC is greater than a threshold SOC. At lower battery SOC levels, there may be insufficient charge to crank the engine (e.g., rotate the engine from zero speed to a first combustion event after accelerating the engine from the most recent zero speed condition). Therefore, it may be desirable inhibit automatic engine stopping (e.g., stopping an engine without a human driver requesting engine stop via a dedicated engine stopping input having sole functions of requesting engine starting and stopping, such as an ignition switch or pushbutton, including ceasing spark and fuel delivery to the engine) if battery SOC is less than a threshold. If battery SOC is greater than the threshold, the answer is yes and method 700 proceeds to 708. Otherwise, the answer is no and method 700 proceeds to 712.

In some examples, method 700 may also require that engine temperature be greater than a threshold temperature for method 700 to proceed to 708. Further, method 700 may require that an actual total amount of time the engine is stopped (e.g., not rotating) be less than a threshold amount of time for method 700 to proceed to 708. If these conditions are not met, method 700 proceeds to 712.

At 708, method 700 judges whether or not driver demand torque is less than a threshold. The driver demand torque may be determined via accelerator pedal position and vehicle speed referencing a function or table that outputs an empirically determined driver demand torque. If method 700 judges that driver demand torque is less than a threshold, the answer is yes and method 700 proceeds to 710. Otherwise, the answer is no and method 700 proceeds to 712. The engine may be automatically stopped and started at lower driver demands where engine torque may not be necessary to conserve fuel.

At 710, method 700 judges if automatic engine stopping is prohibited according to the method of FIG. 8. Automatic engine stopping may be prohibited if it may be expected or predicted that engine cranking time will exceed a threshold amount of time. Vehicle occupants may become irritated or may be experience lower levels of driving satisfaction when engine cranking times are longer than a threshold amount of time. Therefore, automatic engine stopping and starting may be prohibited when engine cranking during automatic engine starting after an engine has been automatically stopped (e.g., not rotating and combusting air and fuel) is expected or predicted to last longer than a threshold amount of time. If method 700 judges that predicted engine cranking time is greater than a threshold amount of time, the answer is yes and method 700 proceeds to 712. Otherwise, method 700 proceeds to 714. The predicted engine cranking time may be determined while the engine is rotating and combusting air and fuel.

At 712, method 700 prohibits automatic engine stopping and automatic engine starting (e.g., starting a stopped engine without a human driver requesting engine starting via a dedicated engine starting input having a sole functions of requesting engine starting and stopping, such as an ignition switch or pushbutton). Thus, even if battery SOC is greater than a threshold and driver demand torque is less than a threshold, automatic engine starting and stopping is prohibited. The engine may still be stopped and started via a vehicle driver or occupant requesting engine starting or stopping via a dedicated engine starting or stopping input device (e.g., a key switch or pushbutton). By prohibiting automatic engine stopping and starting, the vehicle occupants may not be subject to hearing long engine cranking times, which may improve the vehicle driving experience. Method 700 proceeds to exit.

At 714, method 700 allows or permits automatic engine stopping and starting subject to battery SOC, driver demand torque, and other engine and vehicle operating conditions. If automatic engine stopping conditions are present, then the engine may be automatically stopped and started. For example, an engine of a vehicle may be automatically stopped via a vehicle controller if certain conditions are met. The conditions may be different for different driving conditions and vehicle configurations. In one example, where the vehicle is not a hybrid vehicle, the controller may automatically stop the engine without a driver applying input to device that has a sole function of starting and/or stopping the vehicle's engine (e.g., an ignition switch or an ignition pushbutton). The engine may be automatically stopped if driver demand torque is less than a threshold, such as a released accelerator pedal, the vehicle brake pedal is applied, battery SOC is greater than a threshold, and vehicle speed is less than a threshold speed. In some circumstances the vehicle may be moving while the engine is turned off and stopped while in other circumstances the vehicle may be stopped when the engine is turned off and stopped. If the vehicle is a hybrid vehicle, the engine may be automatically turned off and stopped when an electric motor has capacity to provide the driver demand torque, and battery state of charge is greater than a threshold. Of course, the engine may be automatically stopped responsive to other vehicle conditions.

If the engine has been automatically stopped, the engine may be automatically started without a vehicle occupant specifically manipulating an input that has a dedicated sole function of starting and/or stopping the engine. If the engine is not in a hybrid vehicle, the engine may be automatically started by engaging a starter, rotating the engine at a cranking speed, and supplying fuel and spark to the engine in response to a driver releasing a brake pedal while the vehicle is stopped. Further, the engine may be automatically started by engaging a starter, rotating the engine at a cranking speed, and supplying fuel and spark to the engine in response to a driver releasing applying an accelerator while the brake pedal is applied or not applied. If the engine is in a hybrid vehicle, it may be automatically started (e.g., including rotated, supplied spark and fuel) from a stopped state in response to driver demand torque exceeding a threshold, battery SOC less than a threshold, and emissions device temperature decreasing to less than a threshold temperature. Of course, the engine may be automatically started responsive to other vehicle conditions.

Method 700 may also collect data during engine starting sequences. For example, method 700 may store variables I_crank, $V_{OCV}$, R_batt, R_starter, E_starter, V_batt, I_starter, E_crank, E_ohm-hear and other variables mentioned in the description of FIGS. 7 and 8 to transitory or non-transitory memory. Method 700 proceeds to exit.

Referring now to FIG. 8, a method for selectively prohibiting automatic engine stopping and starting is shown. At least portions of method 800 may be implemented as executable controller instructions stored in non-transitory memory. Additionally, portions of method 800 may be actions taken in the physical world to transform an operating state of an actuator or device. The method of FIG. 8 may be incorporated into the system of FIGS. 1 and 2 as executable instructions stored in non-transitory memory.

At 802, method 800 determines a vehicle configuration and vehicle status. The vehicle configuration may be based on types of sensors for determining vehicle operating conditions such as starter motor winding resistance, internal battery resistance, battery open circuit voltage, starter current, and other electrical system attributes. The vehicle configuration may be stored as a value of a variable stored in controller non-transitory memory. In addition, method 800 may determine the status of the vehicle. The status of the vehicle may include determining whether or not any of the various vehicle sensors are degraded. For example, the status may identify if a battery voltage or current sensor is degraded. Method 800 proceeds to 804 after determining vehicle status and vehicle configuration.

At 804, method 800 selects an engine cranking and monitoring algorithm to activate. The selection of the engine cranking and monitoring algorithm is selected responsive to the vehicle configuration and status. If the vehicle configuration supports estimating engine cranking energy and its various parameters, algorithm B may be selected and activated if the vehicle status indicates sensors for determining engine cranking energy are not degraded. If the vehicle configuration does not support estimating engine cranking (e.g., the vehicle is not configured with a particular sensor) or if a sensor that supports algorithm B is degraded, method 800 may select and activate algorithm A. If method 800 activates algorithm A, method 800 proceeds to 806. Otherwise, method 800 proceeds to 820 and selects and activates algorithm B.

At 806, method 800 estimates maximum or peak engine cranking current. In one example, method 800 estimates maximum engine cranking current supplied by the battery to the starter motor via the following equation:

$$I\_crank = V_{ocv}/(R\_batt + R\_starter)$$

where I_crank is maximum current supplied by the battery to the engine starter, $V_{ocv}$ is battery open circuit voltage, R_batt is internal resistance of the battery supplying power to the starter, and R_starter is the resistance of starter motor windings. $V_{ocv}$ may be determined via monitoring a voltage of the battery when the battery is open circuited from electric consumers, R_batt may be determined by measuring battery open circuit voltage and battery voltage while supplying current to a load (e.g., $V_{ocv}-V_L/I$, where $V_{ocv}$ is open circuit battery voltage, $V_L$ is voltage of battery supplying current to the load, and I is current supplied to the load) or other known method, R_starter may be determined by supplying a voltage to the starter windings and dividing the voltage by the current flowing through the starter windings or another known method. Method 800 proceeds to 808 after estimating engine cranking current. Note that engine cranking current is estimated before the engine is stopped while the engine is rotating so that engine stopping may be prohibited if estimated engine cranking time is longer than a threshold amount of time.

At 808, method 800 estimates engine cranking time (e.g., an amount of time between when an engine starts rotating from stop to a time where the engine is accelerating or maintaining engine speed under the engine's own power). In one example, maximum engine cranking current indexes or references a function such as shown in FIG. 5 and the function or table outputs a predicted or estimated engine cranking time responsive to the maximum engine cranking current. Further, in other examples, the table or function may also be referenced based on engine temperature so that the predicted or estimated cranking time compensates for engine temperature. Method 800 proceeds to 810.

At 810, method 800 judges if predicted engine cranking time is less than a threshold amount of time. The threshold amount of time may be a fixed value or a value that varies with other vehicle operating conditions. If method 800 judges that the predicted engine cranking time is less than (L.T.) a threshold, the answer is yes and method 800 proceeds to 814. Otherwise, the answer is no and method 800 proceeds to 812.

At 814, method 800 permits or allows automatic engine stopping and starting subject to battery SOC, vehicle speed, and constraints other than estimated engine cranking time. Method 800 proceeds to 816.

At 812, method 800 prohibits automatic engine stopping so that vehicle occupants may not be subjected to longer engine cranking times during automatic engine starting. Thus, the vehicle driving experience may be improved. Method 800 proceeds to 816.

At 816, method 800 judges if the engine is stopped and if the engine has been automatically stopped. If so, the answer is yes and method 800 proceeds to 818. Otherwise, the answer is no and method 800 proceeds to exit. Method 800 may judge that the engine is stopped and that the engine was automatically stopped based on a bit or variable stored in memory.

At 818, method 800 continues to estimate or predict engine cranking time while the engine is stopped via whichever of algorithm A and algorithm B is activated. Method 800 proceeds to 820.

At 820, method 800 judges if the predicted engine cranking time is greater than (G.T.) a threshold amount of time. If so, the answer is yes and method 800 proceeds to 822. Otherwise, the answer is no and method 800 proceeds to exit.

At 822, method automatically starts the engine by cranking the engine and supplying spark and fuel to the engine. By automatically starting the engine, excessively long engine cranking events may be avoided and battery SOC may be increased. Method 800 proceeds to exit after automatically starting the engine.

At 830, method 800 estimates engine cranking energy according to the following equation:

$$E\_starter = \text{integration of } V\_batt * I\_starter \text{ during crank} = E\_crank + E\_ohm\text{-heat}$$

where E_crank is energy used to crank the engine shaft; E_ohm-heat is heat generated in starter circuit, not used to crank engine shaft; V_batt is voltage between battery terminals; I_starter is current of starter during crank, approximately the same of battery current. During engine cranking electric energy is transferred from the battery to the starter. The integration may be based on a time from cranking the engine from zero speed during a most recent engine stop to a first combustion event since the most recent engine stop.

A relationship between battery parameters and crank shaft energy can be calculated with following simplified equations:

$$I\_starter = V\_ocv/(R\_batt + R\_starter + X\_starter)$$

$$V\_batt = V\_ocv - I\_starter * R\_batt$$

$$P\_starter = V\_batt * I\_starter$$

$$P\_crank = P\_starter - I\_starter * I\_starter * R\_starter$$

$$E\_starter = \text{Integration of } P\_starter \text{ during crank time}$$

$$E\_crank = \text{Integration of } P\_crank \text{ during crank time}$$

where V_batt is battery voltage curve during crank; P_starter is total electric power provided to starter from battery; P_crank is power provided to starter from battery, starter ohm heat excluded; E_starter is total energy provided to starter from battery during crank; E_crank is energy provided to starter from battery during crank, starter ohm heat excluded; and X_starter is starter impedance curves. The I_starter equation is a simplified equation used to estimate battery current curve in next warm crank. Starter impedance X_starter is a curve based on time and it is measured in previous successful warm cranks and saved in memory of the controller. E_crank is the estimated available energy provided by the battery to starter shaft during a next warm crank. At 832, E_crank is used to determine predicted crank time. For a successful warm crank, available energy from the battery (E_crank) must be larger than or equal to a threshold E_crank_min, where E_crank_min is determined based on measured battery voltage and current of previous successful warm cranks. Therefore, the engine crankshaft can reach the expected rotation speed within an expected time.

Voltage, current, and starter impedance curves in multiple previous successful warm engine cranks are recorded and saved in the controller. The E_crank value may be calculated based data of multiple previous successful warm engine cranks. Then, the predicted engine cranking time for next engine cranking is calculated based on E_crank and a correlation as shown in FIG. 4. Within the first-order approximation, the predicted crank time in next warm crank is estimated with following equation:

$$T\_CrankEstimation = T\_CrankEstimation * E\_crank\_NextCrank/E\_crank\_PreviousCrank$$

where T_CrankEstimation is estimated crank time in next warm crank, used to enable/disable automatic engine stop; T_CrankEstimation is measured crank time in a last previous warm engine cranking period; E_crank_NextCrank is estimated engine crank energy based on estimated crank voltage V_batt and crank current I_starter; E_crank_PreviousCrank is measured engine crank energy based on measured engine cranking battery voltage and engine cranking current. In some examples, battery cranking voltage curves, engine cranking current curves, and corresponding engine cranking times in multiple previous warm engine cranking events are saved and used for estimation of next warm crank time. Method 800 proceeds to 810 after predicted engine cranking time is determined. The predicted engine cranking time and engine cranking energy may be determined while the engine is rotating and combusting air and fuel.

In this way, a predicted engine cranking time may be determined based on maximum engine cranking current or predicted energy to crank the engine. If the vehicle is a low cost configuration, algorithm A may be activated. Alternatively, if a sensor is degraded, algorithm A may be activated since it is less complex. If the vehicle boasts a larger sensor set, algorithm B may be activated.

Thus, the methods of FIGS. 7 and 8 provide for a vehicle operating method, comprising: automatically stopping and starting an engine; and prohibiting automatic stopping of the engine in response to an estimated engine cranking time exceeding a threshold. The method includes where the estimate of engine cranking time is based on an amount of electrical energy consumed to crank the engine from a most recent engine stop to a first combustion event since the most recent engine stop. The method includes where automatically stopping the engine includes ceasing fuel flow to the engine and ceasing engine rotation automatically, and further comprising starting the engine in response to the estimated engine cranking time exceeding the threshold after the engine has been automatically stopped during a most recent engine stop where the engine stops rotating. The method includes where the estimate of engine cranking time is based on an amount of electrical cranking current consumed to crank the engine. The method includes where the estimate of engine cranking time is performed while the engine is operating. The method further comprises prohibiting automatic engine stopping in further response to a battery state of charge. The method includes where the estimated engine cranking time is based on internal resistance of a battery. The method includes where the estimated engine cranking time is further based on resistance of a starter motor.

The method of FIGS. 7 and 8 also provides for a vehicle operating method, comprising: automatically stopping and starting an engine; predicting an engine cranking time; and prohibiting automatic stopping of the engine in response to the predicted engine cranking time exceeding a threshold. The method further comprises predicting a maximum battery current during engine cranking. The method further comprises correlating the predicted maximum battery current during engine cranking to the predicted engine cranking time. The method includes where the predicted engine cranking time is responsive to resistance of starter motor windings. The method includes where the predicted engine cranking time is responsive to internal resistance of a battery. The method includes where the predicted engine cranking time is responsive to an open circuit voltage of a battery. The method includes where the predicted engine cranking time is responsive to heat generated in a starter motor.

Note that the example control and estimation routines included herein can be used with various engine and/or vehicle system configurations. The control methods and routines disclosed herein may be stored as executable instructions in non-transitory memory and may be carried out by the control system including the controller in combination with the various sensors, actuators, and other engine hardware. The specific routines described herein may represent one or more of any number of processing strategies such as event-driven, interrupt-driven, multi-tasking, multi-threading, and the like. As such, various actions, operations, and/or functions illustrated may be performed in the sequence illustrated, in parallel, or in some cases omitted. Likewise, the order of processing is not necessarily required to achieve the features and advantages of the example embodiments described herein, but is provided for ease of illustration and description. One or more of the illustrated actions, operations and/or functions may be repeatedly performed depending on the particular strategy being used. Further, at least a portion of the described actions, operations and/or functions may graphically represent code to be programmed into non-transitory memory of the computer readable storage medium in the control system. The control actions may also transform the operating state of one or more sensors or actuators in the physical world when the described actions are carried out by executing the instructions in a system including the various engine hardware components in combination with one or more controllers.

This concludes the description. The reading of it by those skilled in the art would bring to mind many alterations and modifications without departing from the spirit and the scope of the description. For example, I3, I4, I5, V6, V8, V10, and V12 engines operating in natural gas, gasoline, diesel, or alternative fuel configurations could use the present description to advantage.

The invention claimed is:

1. A vehicle operating method, comprising:
   automatically stopping and starting an engine; and
   prohibiting automatic stopping of the engine in response to an estimated engine cranking time exceeding a threshold.

2. The method of claim 1, where the estimate of engine cranking time is based on an amount of electrical energy consumed to crank the engine from a most recent engine stop to a first combustion event since the most recent engine stop.

3. The method of claim 1, where automatically stopping the engine includes ceasing fuel flow to the engine and ceasing engine rotation, and further comprising:
   automatically starting the engine in response to the estimated engine cranking time exceeding the threshold after the engine has been automatically stopped.

4. The method of claim 1, where the estimate of engine cranking time is based on an maximum magnitude of engine cranking current.

5. The method as claimed in claim 4, where the estimate of engine cranking time is performed while the engine is operating.

6. The method of claim 1, further comprising prohibiting automatic engine stopping in further response to a battery state of charge.

7. The method of claim 1, where the estimated engine cranking time is based on internal resistance of a battery.

8. The method of claim 7, where the estimated engine cranking time is further based on resistance of a starter motor.

9. A vehicle operating method, comprising:
   automatically stopping and starting an engine;
   predicting an engine cranking time; and
   prohibiting automatic stopping of the engine in response to the predicted engine cranking time exceeding a threshold.

10. The method of claim 9, further comprising predicting a maximum magnitude of battery current during engine cranking.

11. The method of claim 10, further comprising correlating the predicted maximum magnitude of battery current during engine cranking to the predicted engine cranking time.

12. The method of claim 9, where the predicted engine cranking time is responsive to resistance of starter motor windings and further comprising: automatically starting the engine in response to the predicted engine cranking time exceeding the threshold after the engine has been automatically stopped.

13. The method of claim 9, where the predicted engine cranking time is responsive to internal resistance of a battery.

14. The method of claim 9, where the predicted engine cranking time is responsive to voltage of a battery before engine cranking.

15. The method of claim 9, where the predicted engine cranking time is responsive to heat generated in a starter motor.

16. A vehicle system, comprising:
   an engine including a starter motor;
   a battery selectively supplying charge to the starter motor; and
   a controller including executable instructions stored in non-transitory memory to predict an engine cranking time while the engine is rotating and prohibit automatic stopping of the engine in response to the predicted engine cranking time exceeding a threshold, and instructions to automatically start the engine in response to the predicted engine cranking time exceeding the threshold while the engine is stopped due to an automatic engine stop.

17. The vehicle system of claim 16, further comprising instructions to predict the engine cranking time based on a maximum engine cranking current.

18. The vehicle system of claim 16, further comprising instructions to predict the engine cranking time based on energy to crank the engine.

19. The vehicle system of claim 16, where the engine cranking time is a time from rotating the engine from zero speed to a first combustion event since a most recent engine stop.

20. The vehicle system of claim 16, where the engine cranking time is based on resistance of starter motor windings.

* * * * *